United States Patent [19]

Hoffmann et al.

[11] 4,208,670

[45] Jun. 17, 1980

[54] ONE-TRANSISTOR STORAGE ELEMENT AND A PROCESS FOR THE PRODUCTION THEREOF

[75] Inventors: Kurt Hoffmann, Taufkirchen; Reiner Sigusch, Munich, both of Fed. Rep. of Germany

[73] Assignee: Siemens Aktiengesellschaft, Berlin & Munich, Fed. Rep. of Germany

[21] Appl. No.: 943,066

[22] Filed: Sep. 18, 1978

[30] Foreign Application Priority Data

Sep. 28, 1977 [DE] Fed. Rep. of Germany ....... 2743662

[51] Int. Cl.² .......................................... H01L 27/10
[52] U.S. Cl. ...................................... 357/45; 357/41; 307/238; 29/571
[58] Field of Search ............................ 357/45, 41, 23; 307/238; 29/571

[56] References Cited

U.S. PATENT DOCUMENTS

| 3,997,799 | 12/1976 | Boher | 307/238 |
| 4,139,786 | 2/1979 | Raymond | 307/238 |
| 4,150,389 | 4/1979 | Roessler | 397/23 |

OTHER PUBLICATIONS

Stein, *IEEE Journ. of Solid State Circuits,* vol. SC-8, No. 5, Oct. 1973.

*Primary Examiner*—Martin H. Edlow
*Attorney, Agent, or Firm*—Hill, Van Santen, Steadman, Chiara & Simpson

[57] ABSTRACT

A one-transistor storage element system and a method for producing the same is disclosed wherein each storage element has a sselector field effect transistor and a storage capacitor. A doped semiconductor layer is provided having an oppositely doped bit line provided at a surface thereof, an oppositely doped source zone connecting to the bit line by an oppositely doped connecting zone, and an oppositely doped drain zone also provided at a surface of the semiconductor layer. An insulating layer is provided over the surface of the semiconductor layer and an electrically conductive coating is provided thereon. A first separate part of the conductive coating forms a word line which is positioned over a gap between the source and drain zones. Portions of the word line form a gate beneath which a channel of the transistor is formed. A second separate part of the electrically conductive coating is formed over a portion of the semiconductor layer adjacent the drain zone and forms one of the electrodes of the storage capacitor. The other electrode of the storage capacitor is either provided as a diffusion zone in the semiconductor layer or may be an induced zone. A reference potential line formed by a connecting third part of the electrical conductive layer is also provided.

10 Claims, 8 Drawing Figures

ONE-TRANSISTOR STORAGE ELEMENT AND A PROCESS FOR THE PRODUCTION THEREOF

BACKGROUND OF THE INVENTION

The invention relates to a one-transistor storage element having a bit line, a word line, a storage transistor, and a storage capacitor.

Storage elements of this kind are known, for example, from the "IEEE Journal of Solid-State Circuits", Vol. SC-8, No. 5, Oct. 1973, pages 319 to 323, in particular FIG. 2 and FIG. 4 (incorporated by reference herein), in which the word line which intersects the bit line in the region of the storage element consists of a metallic conductor path which lies above an insulating layer which covers the gate electrode of the transistor, and contacts the gate electrode in the region of a contact hole provided in the insulating layer. However, that portion of storage area which must be provided for this contact hole mitigates against a desired reduction in size of the storage element.

SUMMARY OF THE INVENTION

An object of the invention is to provide a one-transistor storage element which exhibits a drive which is as area-saving as possible.

This is achieved in accordance with the invention by providing an electrically conductive coating over an insulating layer on the semiconductor layer and wherein a first separate part of the electrically conductive coating is formed as a bit line. A portion of the bit line formed over a gap between a source and the drain zone in the semiconductor layer functions as a gate for the storage transistor. A second separate part of the electrically conductive coating forms an electrode of the storage capacitor. A further connecting part of the electrically conductive coating forms a reference potential line. In the method of the invention, the first part of the electrical conductive coating functions as a diffusion mask for the source and drain zones of the storage transistor.

The advantage which can be gained by the invention consists in particular in that the word line and the gate electrode consist of one and the same, electrically conductive coating and thus the problem of contacting in the region of a contact hole between two different conductive levels does not occur in the operation of the selector transistor. The gate electrode simultaneously represents a doping mask which defines the source and drain zone of the field effect transistor from the channel zone.

In a further development of the one-transistor storage element corresponding to the invention the storage capacitor is also connected without a contact hole on the one hand to the drain zone of the selector transistor and on the other hand to a reference potential line.

Advantageous processes for the production of one-transistor storage elements include the steps of coating a doped semiconductor layer with an insulating layer and providing an opening therethrough. In a first doping step, an oppositely doped bit line is formed in the semiconductor layer. Thereafter, an insulating layer is re-established over the semiconductor layer and an opening is formed therein having dimensions which correspond to the source, drain, channel and terminal zones of the transistor. Within the opening, the semiconductor layer is coated with a thin insulating layer and then an electrically conductive coating is provided over the insulating layers. Portions of the conductive coating are removed by mass etching to form a first part thereof which represents the word line and within a region of the thin insulating layer an ion implantation is carried out for doping the source, drain and connection zones of the transistor while employing the first part of the conductive coating as a doping mask.

DESCRIPTION OF THE PREFERRED EMBODIMENTS

Figure 1:
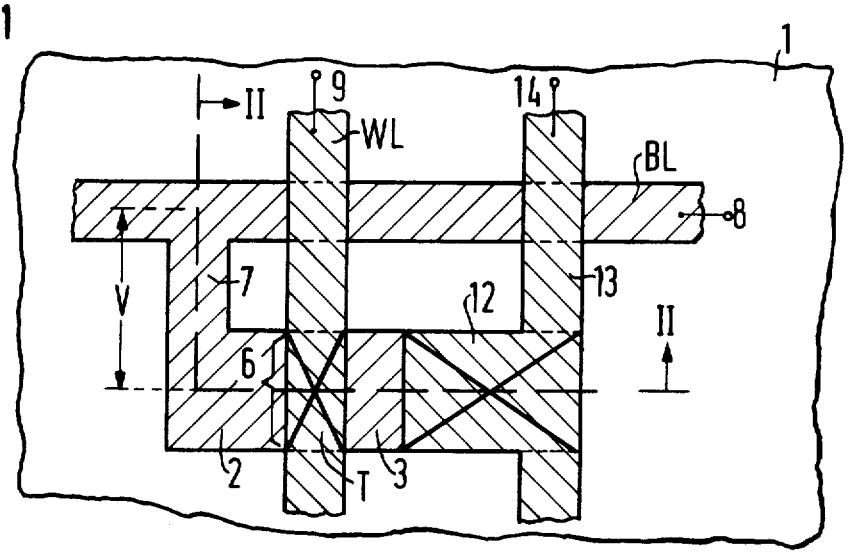
FIG. 1 is a plan view of a one-transistor storage element designed in accordance with the invention.
Figure 2:
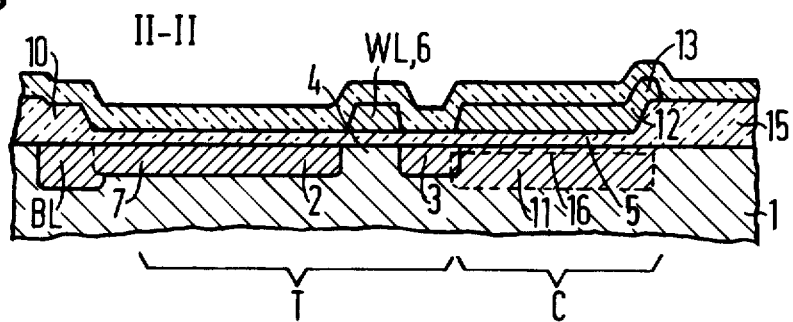
FIG. 2 is a cross-section along the line II—II of FIG. 1.

In FIGS. 1 and 2, a p-doped semiconductor layer 1, in particular a silicon layer, is provided with $n^+$ doped, surface-side zones 2 and 3 which represent the source and drain zone of a selector field effect transistor T. Above the channel zone 4 which extends on the surface side between the source and drain zones 2 and 3 there is arranged a gate electrode 6 which is separated from 1 by a gate oxide layer 5, is formed from a conductive coating, and is composed of a portion of a word line WL which runs vertically in FIG. 1 and is insulated from the semiconductor layer 1 along its entire length. The source zone 2 is connected by a $n^+$ doped connection zone 7 which is attached on the left-hand side in FIG. 2 to a $n^+$ doped zone BL which is provided on the surface-side in the semiconductor layer 1 and which is represented in FIG. 1 as a horizontal strip. Here the zone BL represents a bit line which is provided with an end-side terminal 8. The word line WL is connected to an end-side terminal 9.

As can be seen from FIG. 1, the bit line BL and the word line WL intersect at approximately 90°, and, in accordance with FIG. 2, the bit line BL is arranged on the surface side in the semiconductor layer 1 and the word line WL runs above the semiconductor layer 1. Between the two lines is arranged an insulating layer which covers the surface of the semiconductor layer 1 and which above the channel zone 4 consists of a thin gate oxide layer 5 which passes into a thick field oxide layer 10 above the zone BL. The arrangement of the connection zone 7 approximately parallel to the direction of the work line WL produces a lateral offset V of the bit line BL relative to the line of symmetry of the source-drain path 2-3. Here the edge zones of the section 6 of the word line WL determine the boundaries of the channel zone of the transistor T relative to the source zone 2 or the drain zone 3.

A $n^+$ doped, surface-side zone 11 which is represented in broken lines in FIG. 2 and which adjoins the drain zone 3 then forms one electrode of a storage capacitor C whose counter electrode, which carries a constant potential, consists, in the exemplary embodiment represented in FIGS. 1 and 2, of a second part 12 of the above mentioned, electrically conductive coating which part has a quadrangular outline and in FIG. 1 is represented by the two diagonals of the quadrangle. This second part 12 is connected to a third part 13 of the electrically conductive coating which is strip-like, runs parallel to the word line WL, and represents a reference potential line which is provided with an end-side terminal 14. The second part 12 is separated from the surface of the semiconductor layer 1 by the thin gate oxide layer 5, whereas the third part 13 is fundamentally insulated by a thick field oxide layer 15 which passes into the thin gate oxide layer 5 only at the edge of the electrode zone 11, 12 of C.

If the reference potential which is fed to the terminal 14 is selected to be sufficiently high relative to the surface potential of the semiconductor layer 1 in the electrode region 11 of the storage capacitor C, the n+ doped zone 11 can be dispensed with as in this case a surface-side inversion layer 16 which fully undertakes the electrode function of the zone 11 is formed in 1.

If a plurality of one-transistor storage elements designed in the described manner are arranged on a common, doped semiconductor layer 1 in the form of rows and columns, the bit line BL is common to all the elements arranged in a row whereas the word line WL and the reference potential line 13 are common to all the elements of a column. Here the common bit line is connected to the connection zones 7 of all the elements of a row whereas the gate electrodes 6 of the transistors of all the elements arranged in one column represent different portions of one and the same word line WL, and the electrodes 12 of all the elements arranged in the same column form extensions of one and the same reference potential line 13.

In order to save further storage area it is expedient to release a common reference potential line 13 of this kind from the reference potential and to use it as a common word line for the next column of storage elements. Then the source-drain and connection zones 2, 3 and 7 and the electrode zones 11, 12 of these storage elements are arranged in the same manner with respect to the line 13 as the corresponding parts of the storage elements arranged in the column in question with respect to the word line WL. Since only one of the two columns is selected by the connection of a given voltage to the assigned word line for the write-in or read-out of information, no undesired influence can occur between the individual columns.

It is particularly advantageous for the conductive coating from which are formed the gate electrode 6, possibly the counter electrode 12 of the storage capacitor C connected to the reference potential, and the reference potential lines 13 to consist of a highly doped semiconductor material, in particular polycrystalline silicon. On the other hand, this conductive coating can also consist of a metallic coating, for example aluminum.

During operation a logic "1", which is represented by a signal voltage of e.g. 5 V on the bit line BL, is written-in to a storage element designed as illustrated in FIGS. 1 and 2 in that the word line 9 is supplied with a signal of likewise 5 V so that the selector transistor T passes into the conductive state and the signal voltage is fed via the zones 7, 2, 4 and 3 to the electrode 11 and to the inversion layer 16 of the storage capacitor C. As a result C becomes charged and stores the information following the blockage of the transistor T which occurs due to the disconnection of the signal on the word line WL. When the stored information is read-out, the bit line BL is first brought to an average potential which lies between the potentials assumed by the electrode 11 during the storage of a "1" or a "0" and then, in dependence upon the charge state of C, charge exchange processes take place between C and the line capacitance of the bit line BL in the one or the other direction. This results in potential shifts in the one or other direction which can be separately analyzed on the bit line BL.

Figure 3A:
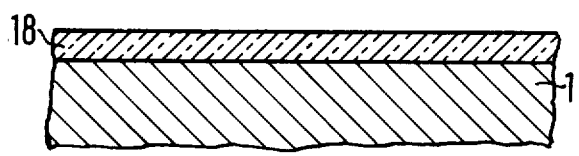
FIGS. 3a-3f schematically illustrate individual steps of a production process for a storage element corresponding to FIGS. 1 and 2.
Figure 3B:
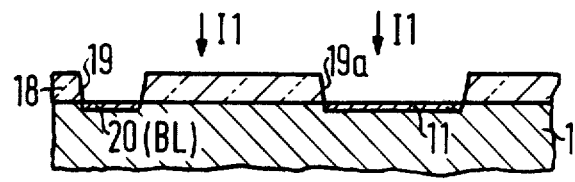
Figure 3C:
Figure 3D:
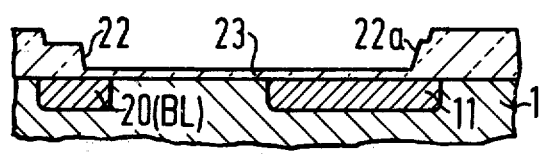
Figure 3E:
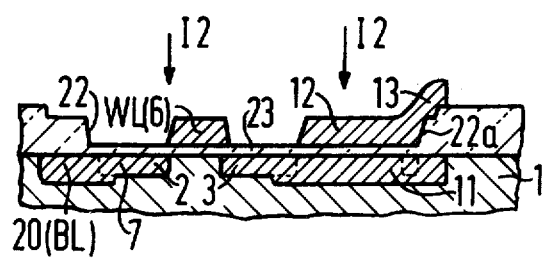
Figure 3F:
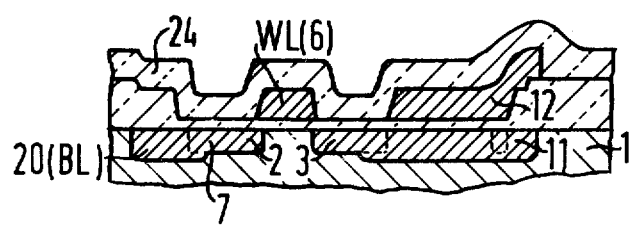

The production of an experimental embodiment of the invention corresponding to FIGS. 1 and 2 has been based upon a p-doped silicon layer having a specific resistance of 20 ohms-cm. First the entire surface of the silicon layer was coated with a 300 to 600 nm thick insulating layer 18 composed of $SiO_2$ (FIG. 3a). Then, in a photoetching step, this insulating layer 18 was provided with an opening 19 through which, in a first doping step, a surface-side, strip-like zone 20 was produced which was doped oppositely and which corresponded to the bit line BL of FIGS. 1 and 2 (FIG. 3b). The doping step consisted of an implantation II of phosphorus or arsenic ions in a dose of $5 \cdot 10^{15}$ to $1 \cdot 10^{16} cm^2$ at an ion acceleration voltage of 20 to 50 kV. A corresponding diffusion step could also be used in place of this implantation. The activation of the implanted alien atoms was carried out at a temperature of 900° to 1000° C. in an oxygen atmosphere, whereby the zone 20 extended more deeply into the semiconductor layer 1 and a new $SiO_2$ layer 21 grew within the opening 19 (FIG. 3c). Then a photoetching step was employed in order to provide the opening 22 which corresponded in area to the source-drain and connection zones 2, 3 and 7 of the transistor T and its channel zone 4, and in a further oxidation step was provided with a 30 to 60 nm thick gate oxide layer 23 (FIG. 3d). Then the entire surface was provided with an electrically conductive coating which, in the process executed, consisted of an approximately 400 to 600 nm thick layer of polycrystalline silicon. In a further photo-etching step, the last-mentioned layer was removed again so that only that part thereof representing the word line WL including the gate electrode 6 of T remained (FIG. 3e). Finally a further doping step was carried out in the form of a new ion implantation 12 as a result of which phosphorus and arsenic ions in a dose of $5 \cdot 10^{15}$ to $1 \cdot 10^{16} cm^2$ were implanted at an acceleration voltage of 80 to 120 kV into those regions of the semiconductor layer 1 covered only by the gate oxide 23. In this way the n+ doped source, drain and connection zones 2, 3 and 7 of the selector transistor T were formed, where that part of the word line WL representing the gate electrodes 6 served as a doping mask. The implanted atoms were activated again at 900° to 1000° C. Then a 300 to 400 nm thick $SiO_2$ layer 24 was deposted upon the entire surface (FIG. 3f).

In accordance with a further development of the above described process, the opening 22 was contrived to be such that it also enclosed the region of the electrode 12 of the storage capacitor C and extended to the right-hand edge 22a (FIG. 3d). Within the opening 22, 22a which was coated with the gate oxide layer 23, following the partial etching away of the conductive coating (FIG. 3e) there then remained on the one hand a second part thereof which represented the one electrode 12 of the storage capacitor C and on the other hand the third part 13 which formed the reference potential line.

In accordance with a variant of the above described further development of the production process, in addition to the opening 19 there was also provided an opening 19a (FIG. 3b), and simultaneously to the doping of the zone 20 which represented the bit line BL, through the opening 19a a n+ doping of the zone 11 was carried out which formed the electrode of the storage capacitor C which was connected to the drain zone 3 of the transistor T and arranged on the surface side in the semiconductor layer 1.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A one-transistor storage element system wherein each storage element has a selector MIS field effect transistor and a storage capacitor, comprising:
   (a) a doped semiconductor layer of first conductivity type and oppositely doped zones therein which form source and drain zones of the transistor;
   (b) a bit line formed of a strip-like, oppositely doped zone in the semiconductor layer which is connected to the source zone;
   (c) a gate electrode of the transistor which is arranged in insulated fashion above the semiconductor layer and driven via a word line;
   (d) the drain zone of the transistor connecting to a reference potential line through the storage capacitor;
   (e) the word line comprising a first, strip-like part running transversely to a source-drain path of the transistor and formed of an electrically conductive coating which is separated from a surface of the semiconductor layer by an insulating layer, a portion of the word line strip-like part forming at least a part of the gate electrode of the transistor and edge zones of the strip-like part defining a boundary of a channel zone of the transistor relative to the source and drain zones; and
   (f) a source zone of the transistor connecting to the bit line via a connection zone running approximately parallel to the word line, said bit line running approximately in a direction of the source-drain path but offset therefrom.

2. A one-transistor storage element system as claimed in claim 1 wherein a second part of the electrically conductive coating forms an electrode of the storage capacitor, and that a third part of the electrically conductive coating forms a strip-like part forming the reference potential line connected to the second part.

3. A one-transistor storage element system as claimed in claim 1 wherein a plurality of the one transistor storage elements are provided on the same doped semiconductor layer; the source zones of the transistors of a first group of the storage elements being connected to the oppositely doped strip-like zone forming the bit line which is common to the first group; first parts of electrically conductive coatings of a second group of storage elements forming parts of the word line which is common to the second group.

4. A one-transistor storage element system of claim 3 wherein third parts of the conductive coatings of the second group of storage elements form the reference potential line which is common to storage capacitors of this group.

5. A one-transistor storage element system as claimed in claim 4 wherein a third part of the conductive coatings of the second group of storage elements forms a word line which is common to a further group of storage elements when the third part is not connected to a word line.

6. A one-transistor storage element as claimed in claim 1 in which the conductive coating comprises a highly doped semiconductor material formed of polycrystalline silicon.

7. A method for the production of a one-transistor storage element having a bit line, a word line and a transistor, comprising the steps of:
   (a) coating a doped semiconductor layer with an insulating layer and providing an opening therethrough;
   (b) forming in a first doping step an oppositely doped bit line in the semiconductor layer;
   (c) re-establishing an insulating layer over the semiconductor layer and forming an opening therein having dimensions sufficient to permit formation of a source zone, drain zone, channel zone and connection zone of the transistor;
   (d) within the opening coating the semiconductor layer with a thin insulating layer and then providing the thin insulating layer and insulating layer with an electrically conductive coating;
   (e) removing by masked etching steps portions of the conductive coating to form a first part thereof which represents the word line; and
   (f) within a region of the thin insulating layer carrying out an ion implantation into the semiconductor layer for doping the source, drain and connection zones of the transistor while employing the first part of the conductive coating as a doping mask.

8. A method for the production of a one-transistor storage element having a bit line, a word line, a reference potential line, a transistor and a storage capacitor, comprising the steps of:
   (a) coating a doped semiconductor layer with an insulating layer and providing an opening therein;
   (b) in a first doping step providing through the opening an oppositely doped bit line arranged on a surface side in the semiconductor layer;
   (c) re-establishing an insulating layer over the semiconductor layer and providing openings therein, one of which corresponds to source, drain, channel and connection zones of the transistor and another to an electrode zone of the storage capacitor;
   (d) coating the semiconductor layer within the openings with a thin insulating layer;
   (e) providing an electrically conductive coating over the thin insulating layer and insulating layer; remaining portions of the conductive coating by masked etching steps until a first part which forms the word line, a second part which represents an electrode of the storage capacitor, and a third part which represents the reference potential line remain;
   (f) within a region of the thin insulating layer carrying out an ion implantation for doping the source, drain and connection zones of the transistor employing the first and second parts of the conductive coating as a doping mask.

9. The method of claim 8 wherein during the first doping step an electrode for the storage capacitor is provided through an additional opening during formation of the bit line.

10. A single-transistor storage element, comprising:
    (a) a bit line, a word line, a reference potential line, a storage transistor having one end of a source-drain path connecting through a storage capacitor to the reference potential line and the other end to the bit line, a gate of the transistor being formed by a portion of the word line;
(b) a semiconductor layer of first conductivity type;
(c) the bit line and source zone of the transistor being formed as connecting doped second conductivity type regions at a surface of the semiconductor layer;
(d) a drain zone of the transistor being formed as a doped second conductivity type region at a surface of the semiconductor layer spaced from the source zone;
(e) an insulating layer over the surface of the semiconductor layer; and
(f) an electrically conductive coating over the insulating layer having a first separate portion forming the word line positioned over a portion of the semiconductor layer between the source zone and drain zone, and a second separate portion of the conductive coating above a portion of the semiconductor layer adjacent the drain zone forming an electrode of the storage capacitor and the reference potential line.

* * * * *